(12) United States Patent
Gupta et al.

(10) Patent No.: US 8,866,531 B2
(45) Date of Patent: **\*Oct. 21, 2014**

(54) BROADBAND ANALOG RADIO-FREQUENCY INTEGRATOR

(75) Inventors: Dev V. Gupta, Concord, MA (US); Zhiguo Lai, Acton, MA (US)

(73) Assignee: Newlans, Inc., Acton, MA (US)

( * ) Notice: Subject to any disclaimer, the term of this patent is extended or adjusted under 35 U.S.C. 154(b) by 28 days.

This patent is subject to a terminal disclaimer.

(21) Appl. No.: 13/576,635

(22) PCT Filed: Feb. 11, 2011

(86) PCT No.: PCT/US2011/024542
§ 371 (c)(1),
(2), (4) Date: Aug. 1, 2012

(87) PCT Pub. No.: WO2011/152896
PCT Pub. Date: Dec. 8, 2011

(65) Prior Publication Data
US 2012/0293233 A1 Nov. 22, 2012

Related U.S. Application Data

(60) Provisional application No. 61/359,108, filed on Jun. 28, 2010, provisional application No. 61/304,064, filed on Feb. 12, 2010.

(51) Int. Cl.
*G06G 7/18* (2006.01)
*H03F 1/22* (2006.01)
(Continued)

(52) U.S. Cl.
CPC ........ *H03F 3/45183* (2013.01); *H03H 2210/04* (2013.01); *H03F 1/223* (2013.01); *H03H 3/45188* (2013.01); *H03F 2203/45318*
(Continued)

(58) Field of Classification Search
USPC .................................................. 327/65, 336
See application file for complete search history.

(56) References Cited

U.S. PATENT DOCUMENTS 3,434,060 A  3/1969 Painter et al.
3,978,416 A  8/1976 Sutphin, Jr.
(Continued)

FOREIGN PATENT DOCUMENTS

EP  0579875 A1  1/1994
GB  2 439 116 A  12/2007
(Continued)

OTHER PUBLICATIONS

Notification of Transmittal of International Search Report and Written Opinion of the International Searching Authority of PCT/US2011/024542, date of mailing Oct. 31, 2011.
(Continued)

*Primary Examiner* — William Hernandez
(74) *Attorney, Agent, or Firm* — Hamilton, Brook, Smith & Reynolds, P.C.

(57) ABSTRACT

Broadband analog radio-frequency devices can be used to create building blocks for scalable analog signal processors that operate over bandwidths of 50 MHz to 20 GHz or more. Example devices include integrators (transconductors), digitally controlled attenuators, buffers, and scalable summers implemented using deep sub-micron CMOS technology. Because the devices are implemented in CMOS, the ratio of trace/component size to signal wavelength is about the same as that of low-frequency devices implemented in printed circuit boards. Combining this scaling with high gain/high bandwidth enables implementation of feedback and programmability for broadband analog signal processing.

8 Claims, 19 Drawing Sheets

(51) Int. Cl.
*H03F 3/19* (2006.01)
*H03F 3/45* (2006.01)
*H03H 7/24* (2006.01)
*H03H 11/12* (2006.01)
*H03H 11/46* (2006.01)

(52) U.S. Cl.
CPC .. (2013.01); *H03H 2210/021* (2013.01); *H03F 3/19* (2013.01); *H03F 2203/45702* (2013.01); *H03F 2203/45644* (2013.01); *H03H 11/53* (2013.01); *H03H 2210/017* (2013.01); *H03F 3/45201* (2013.01); *H03F 2200/264* (2013.01); *H03F 2203/45374* (2013.01); *H03H 2210/036* (2013.01); *H03H 2210/028* (2013.01); *H03H 7/24* (2013.01); *H03H 3/45197* (2013.01); *H03F 2203/45686* (2013.01); *H03F 2200/36* (2013.01); *H03H 11/1256* (2013.01)
USPC .......................................... 327/336; 327/65

(56) References Cited

U.S. PATENT DOCUMENTS

| | | | |
|---|---|---|---|
| 4,086,539 A | 4/1978 | Gustafson et al. | |
| 4,179,665 A | 12/1979 | Gregorian | |
| 4,504,794 A * | 3/1985 | Fenk | 330/254 |
| 4,507,791 A | 3/1985 | Gundry | |
| 5,144,258 A | 9/1992 | Nakanishi et al. | |
| 5,229,664 A * | 7/1993 | Brehmer | 327/553 |
| 5,325,204 A | 6/1994 | Scarpa | |
| 5,574,678 A | 11/1996 | Gorecki | |
| 5,648,743 A * | 7/1997 | Nagaya et al. | 330/252 |
| 5,880,637 A * | 3/1999 | Gonzalez | 330/253 |
| 5,959,871 A | 9/1999 | Pierzchala et al. | |
| 6,118,794 A | 9/2000 | Cornfield et al. | |
| 6,359,507 B1 | 3/2002 | Myer | |
| 6,424,209 B1 | 7/2002 | Gorecki et al. | |
| 6,677,876 B1 | 1/2004 | Hoggarth et al. | |
| 6,765,377 B1 | 7/2004 | Lu | |
| 6,774,719 B1 | 8/2004 | Wessel et al. | |
| 7,158,591 B2 | 1/2007 | Harris | |
| 7,592,849 B2 * | 9/2009 | Campardo et al. | 327/333 |
| 7,733,950 B2 | 6/2010 | Ko | |
| 8,483,626 B2 * | 7/2013 | Gupta | 455/76 |
| 2001/0041957 A1 | 11/2001 | McCann et al. | |
| 2002/0114270 A1 | 8/2002 | Pierzga et al. | |
| 2002/0196876 A1 | 12/2002 | Takada | |
| 2003/0076907 A1 | 4/2003 | Harris | |
| 2003/0155922 A1 | 8/2003 | Royle et al. | |
| 2004/0021594 A1 | 2/2004 | Melanson | |
| 2005/0038847 A1 | 2/2005 | Cheng et al. | |
| 2005/0052226 A1 | 3/2005 | Doerrer | |
| 2005/0077960 A1 | 4/2005 | Kim et al. | |
| 2005/0130609 A1 | 6/2005 | Nagode et al. | |
| 2005/0266805 A1 | 12/2005 | Jensen | |
| 2005/0275577 A1 | 12/2005 | Bjornsen | |
| 2006/0092057 A1 | 5/2006 | Slavin | |
| 2006/0158247 A1 | 7/2006 | Lee | |
| 2006/0186995 A1 | 8/2006 | Wu et al. | |
| 2006/0261846 A1 | 11/2006 | Twigg | |
| 2006/0284687 A1 | 12/2006 | Abel | |
| 2007/0146071 A1 | 6/2007 | Wu | |
| 2007/0286264 A1 | 12/2007 | Kontola et al. | |
| 2009/0184769 A1 | 7/2009 | Lee et al. | |
| 2011/0051782 A1 | 3/2011 | Gupta et al. | |
| 2012/0001660 A1* | 1/2012 | Gupta | 327/105 |
| 2013/0106487 A1 | 5/2013 | Gupta | |
| 2013/0293264 A1 | 11/2013 | Gupta | |
| 2013/0293308 A1 | 11/2013 | Gupta | |

FOREIGN PATENT DOCUMENTS

| | | | |
|---|---|---|---|
| JP | 2007-058596 A | 3/1995 | |
| JP | 2007-240664 A | 9/1995 | |
| JP | 2008-122408 A | 5/2008 | |
| JP | 2011-526428 | 10/2011 | |
| WO | WO 02/095990 A1 | 11/2002 | |
| WO | WO 2006-131565 A1 | 12/2006 | |
| WO | WO 2009/114123 A2 | 9/2009 | |
| WO | WO 2011/152896 A1 | 12/2011 | |
| WO | WO 2012/061385 A1 | 5/2012 | |
| WO | WO 2012/064551 A2 | 5/2012 | |

OTHER PUBLICATIONS

Notification of Transmittal of the International Search Report and the Written Opinion of the International Searching Authority, or the Declaration for PCT/US2013/057996, "Bi-Quad Calibration", mailed Dec. 26, 2013.

Franco, Sergio, "State-Variable and Biquad Filters" (Jan. 1, 1988), In Design With Operational Amplifiers and Analog Integrated Circuits, (McGraw-Hill Book Company), pp. 136-145, XP009153311.

S.P. et al. 'A Transmitter IC for TETRA Systems Based on Cartesian Feedback Loop Linearization Technique', In: IEEE Journal of Solid-State Circuits, vol. 40, No. 3, Mar. 2005, pp. 707-718.

C.J.S. et al. 'A new adaptive double envelope feedback (ADEF) linearizer for mobile radio power amplifiers', In: IEEE MIT-S International Microwave Symposium Digest, 1994, pp, 573-576.

Notification Concerning Transmittal of International Preliminary Report on Patentability PCT/US2011/058785 "Method and Apparatus for Power Amplifier Linearization," Date of Mailing, May 16, 2013.

International Search Report and Written Opinion of the International Searching Authority miled Feb. 9, 2012 from PCT/US2011/058785, "Method and Apparatus for Power Amplifier Linearization," filed Nov. 1, 2011.

Notification of Transmittal of the International Search Report and the Written Opinion of the the International Searching Authority, or the Declaration for PCT/US2011/058786, "Field-Progammable Analog Array," mailed Jun. 29, 2012.

Notification Concerning Transmittal of a Copy of International Preliminary Report on Patentability PCT/US2011/058786, "Field-Programmable Analog Array," Date of Mailing, May 23, 2013.

Notification of Transmittal of the International Search Report and the Written Opinion of the International Searching Authority, or the Declaration for PCT/US2012/062965 mailed Feb. 26, 2013.

Notification of Transmittal of The international Search Report and the Written Opinion of the International Searching Authority, or the Declaration for PCT/US2009/001512, "Method, System, and Apparatus for Wideband Signal Processing," mailed Oct. 20, 2009.

Supplementary European Search Report, Application No. EP 09721007, "Method, System, and Apparatus for Wideband Signal Processing," dated Nov. 17, 2011.

International Preliminary Report on Patentability, international Application No. PCT/US2009/001512, "Method, System, and Apparatus for Wideband Signal Processing," Date Mailed: Sep. 23, 2010.

International Preliminary Report on Patentability, International Application No. PCT/US2011/024542, "Broadband Analog Radio-Frequency Components," Date Mailed: Aug. 23, 2012.

* cited by examiner

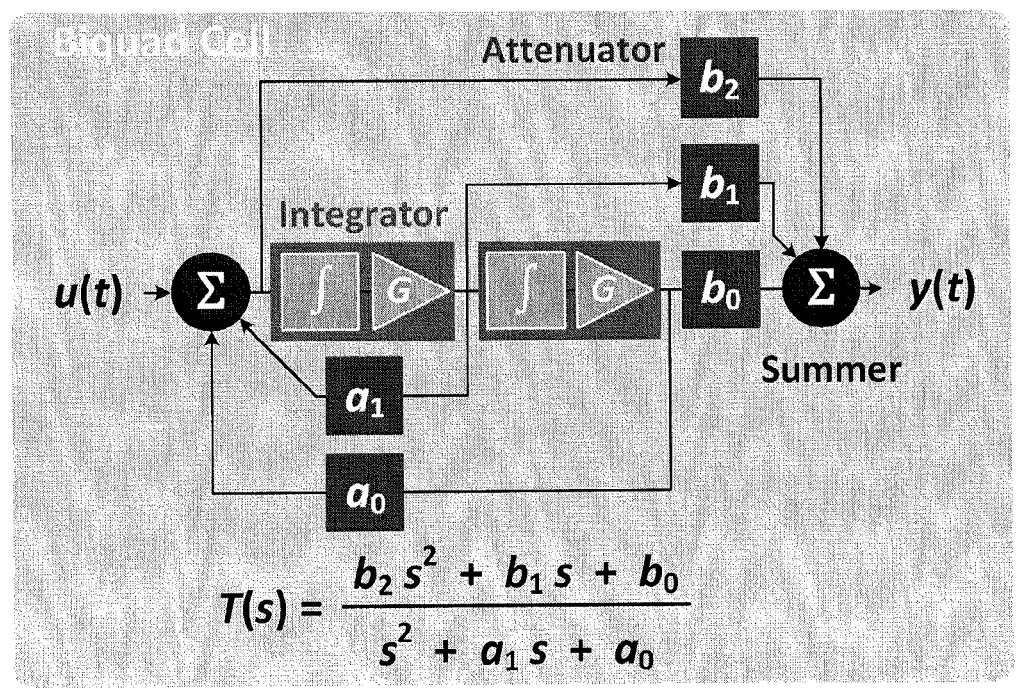
Figure 1: Block diagram of a 2nd order observer canonical form with its transfer function

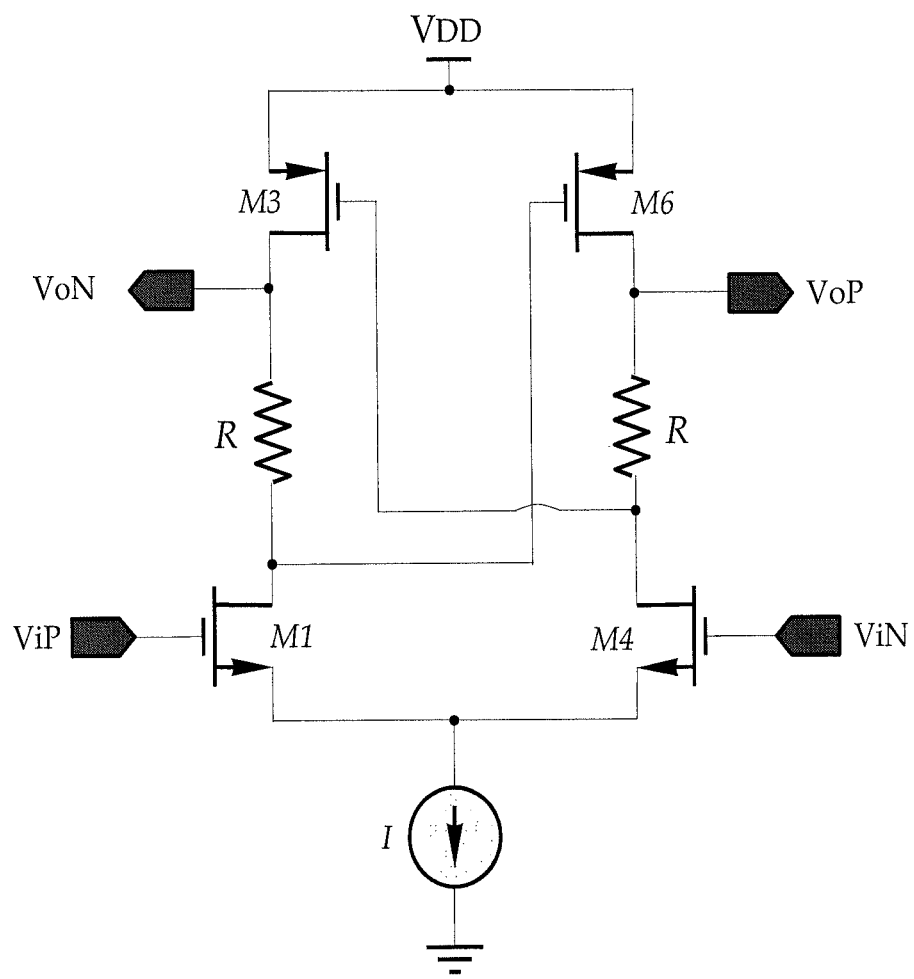
Figure 2: Integrator circuit

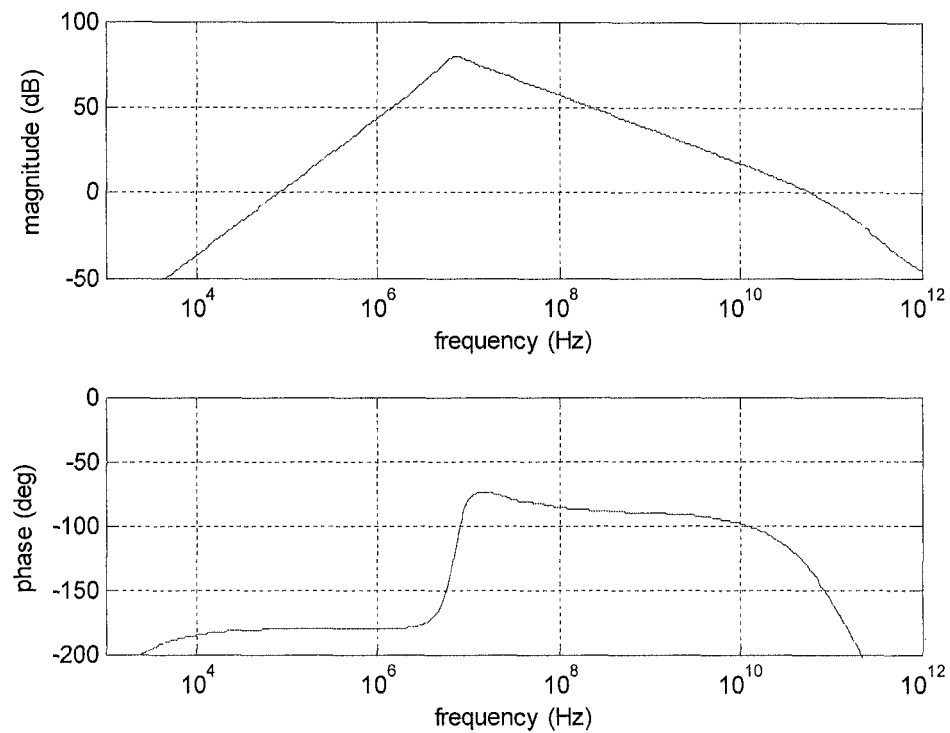
Figure 3: Frequency response of integrator built in TSMC's 65 nm CMOS

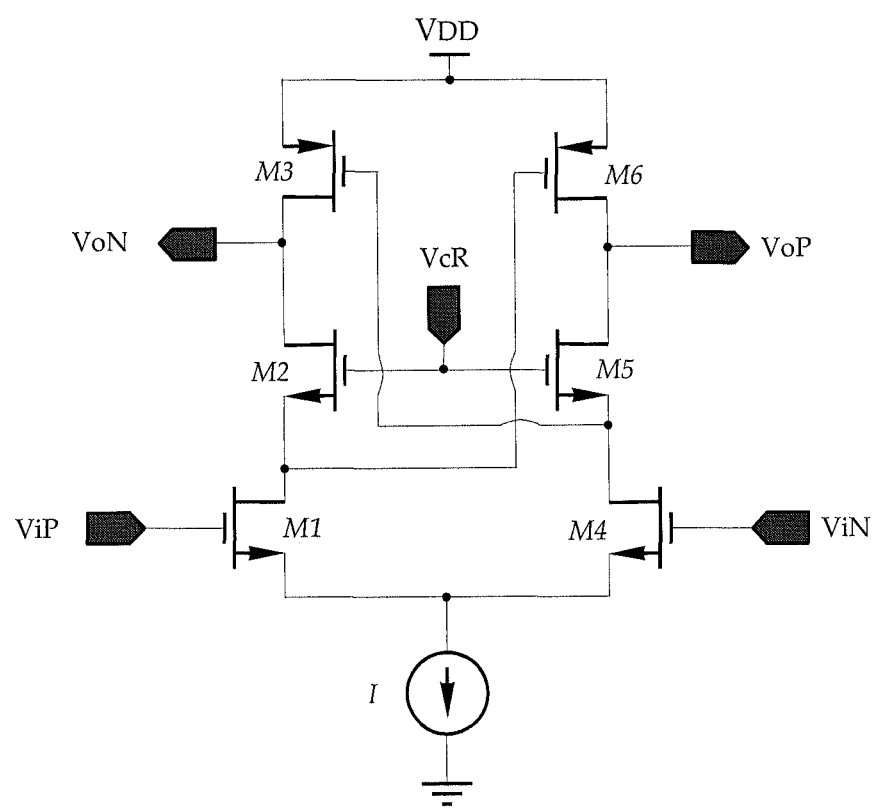
Figure 4: Using a transistor as a voltage controlled resistor

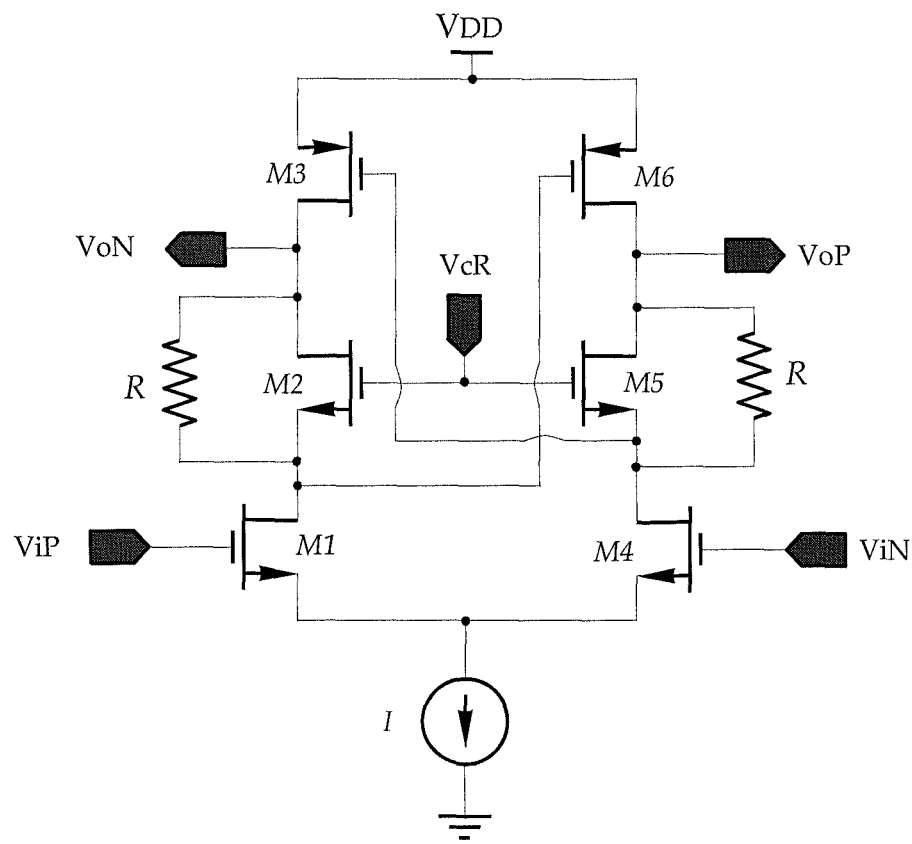
Figure 5: Resistor in parallel with the middle transistor

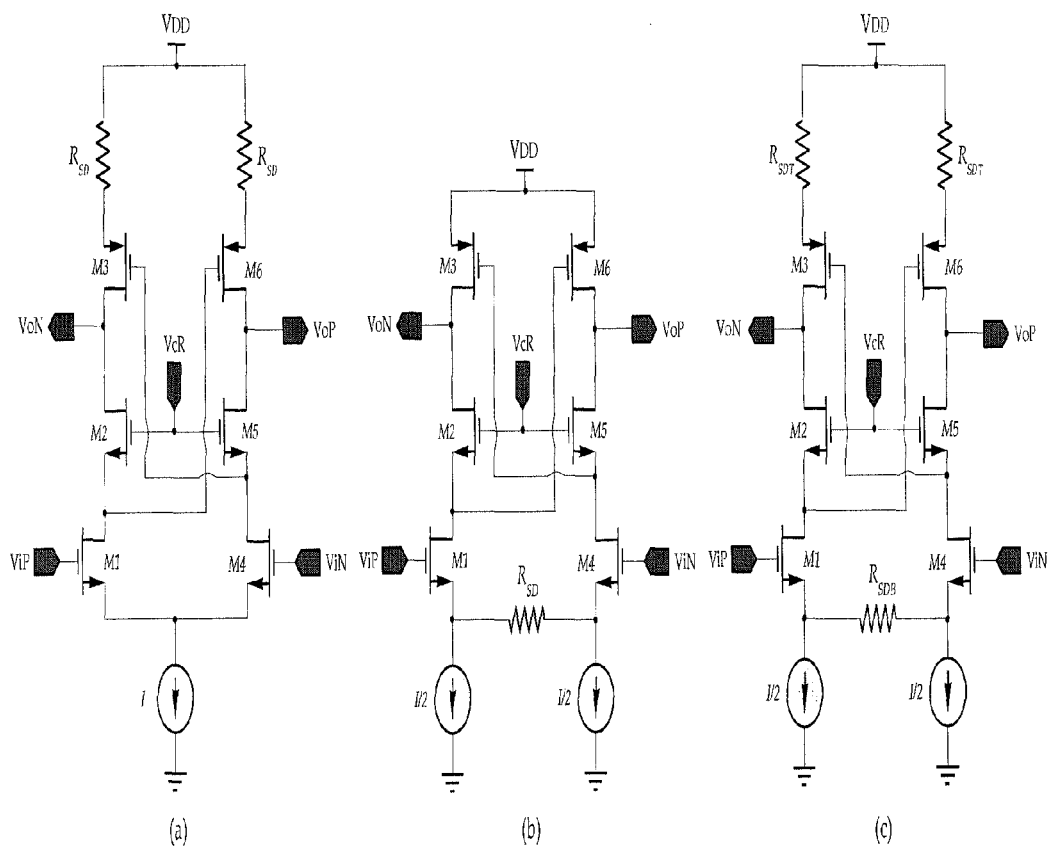
Figure 6: Source degeneration resistors (a) on top; (b) on bottom; (c) on both top and bottom

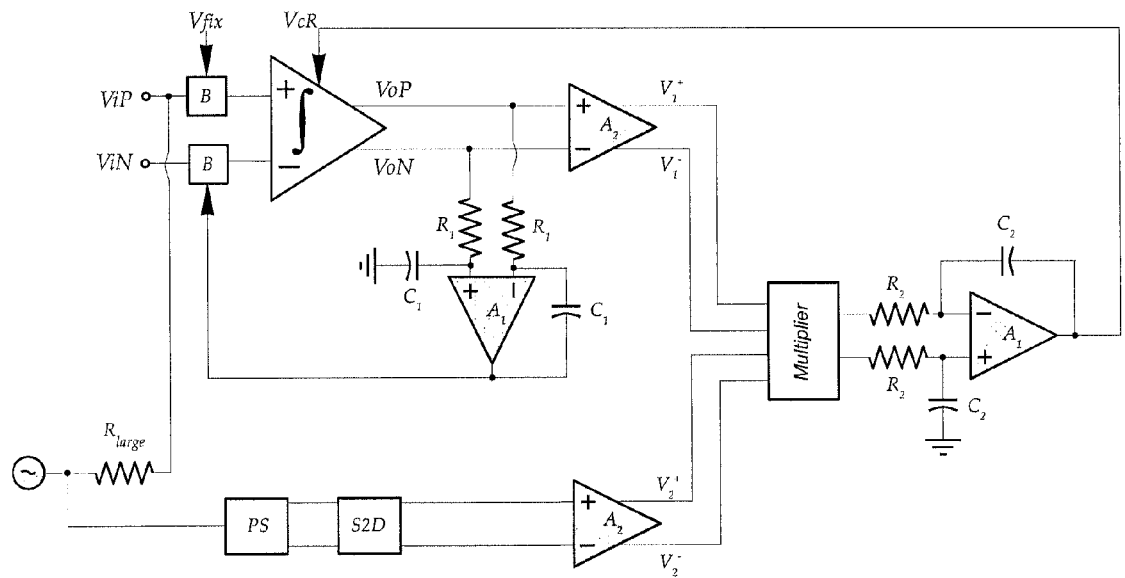
Figure 7: Integrator tuning circuit

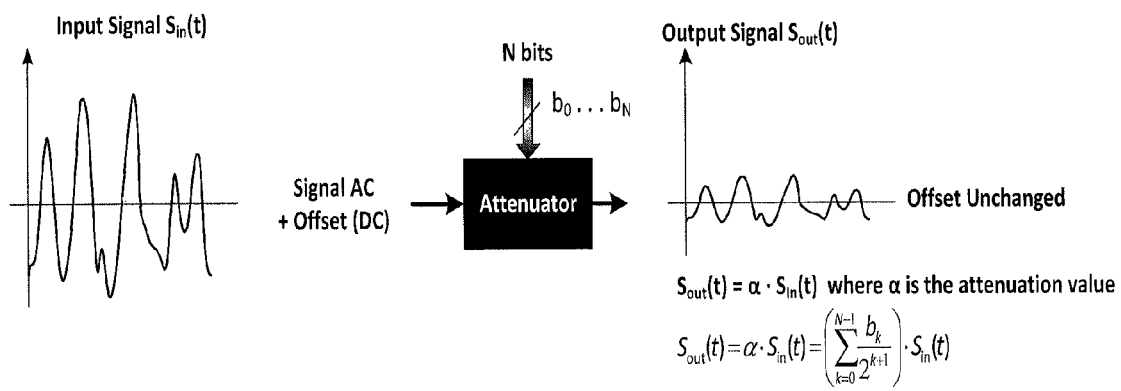
Figure 8: Attenuator

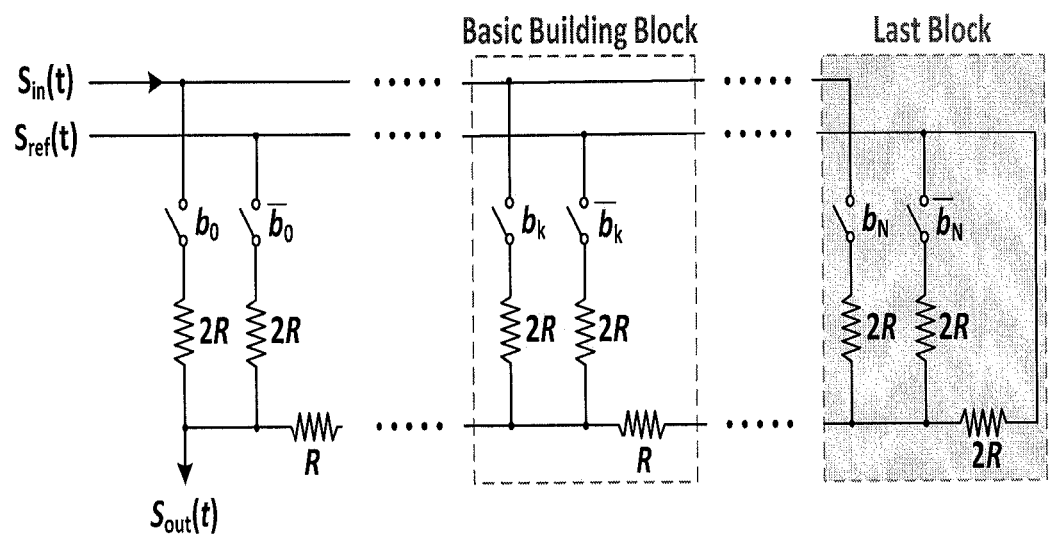
Figure 9: Block diagram of classic R/2R ladder

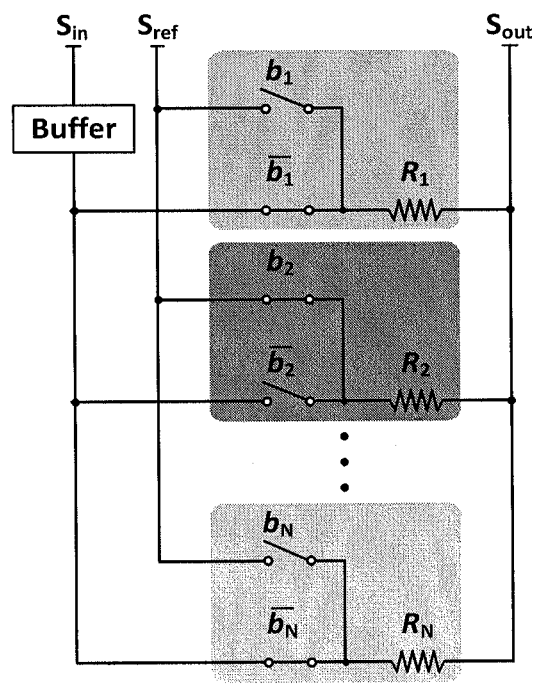
Figure 10: Single stage attenuator

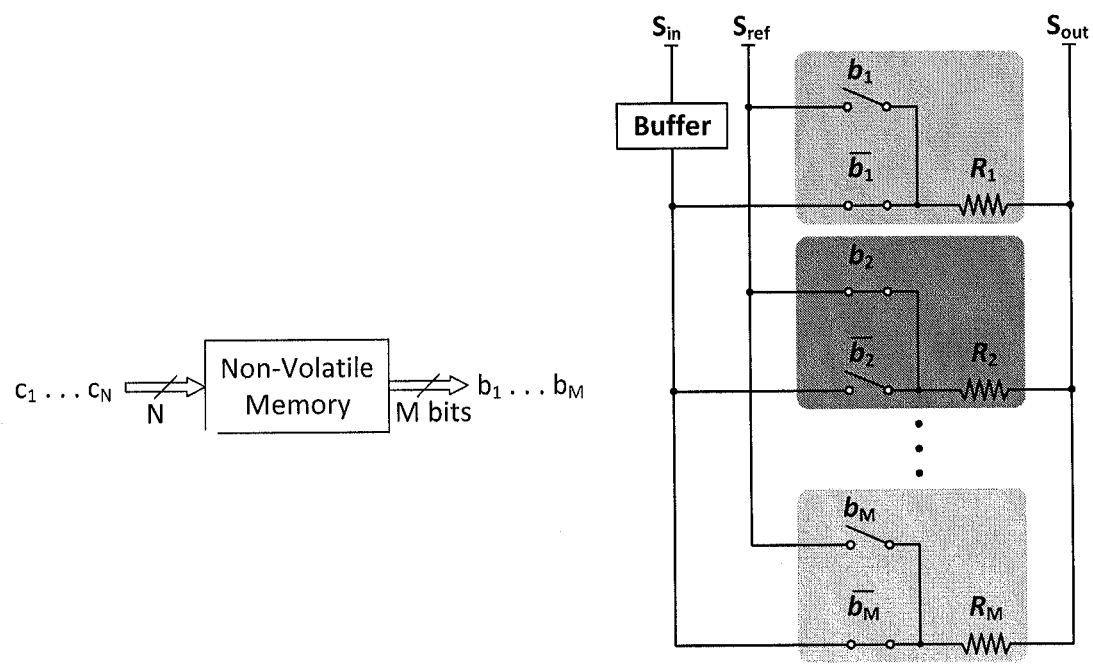
Figure 11: Single stage attenuator with non-volatile memory

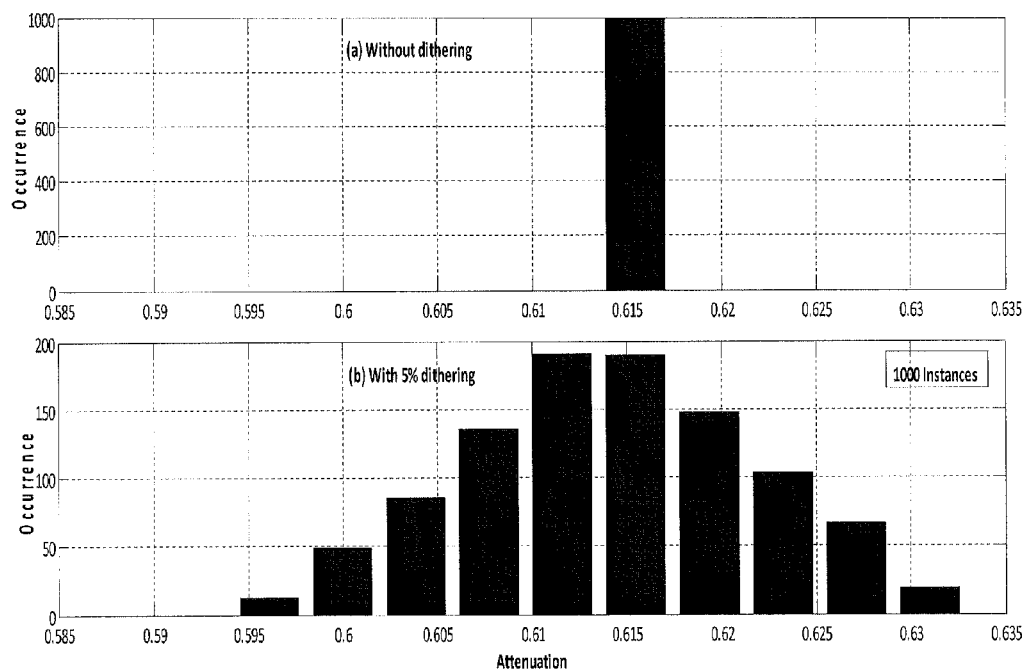
Figure 12: Distribution of attenuation values (a) without dithering, and (b) with 5% dithering

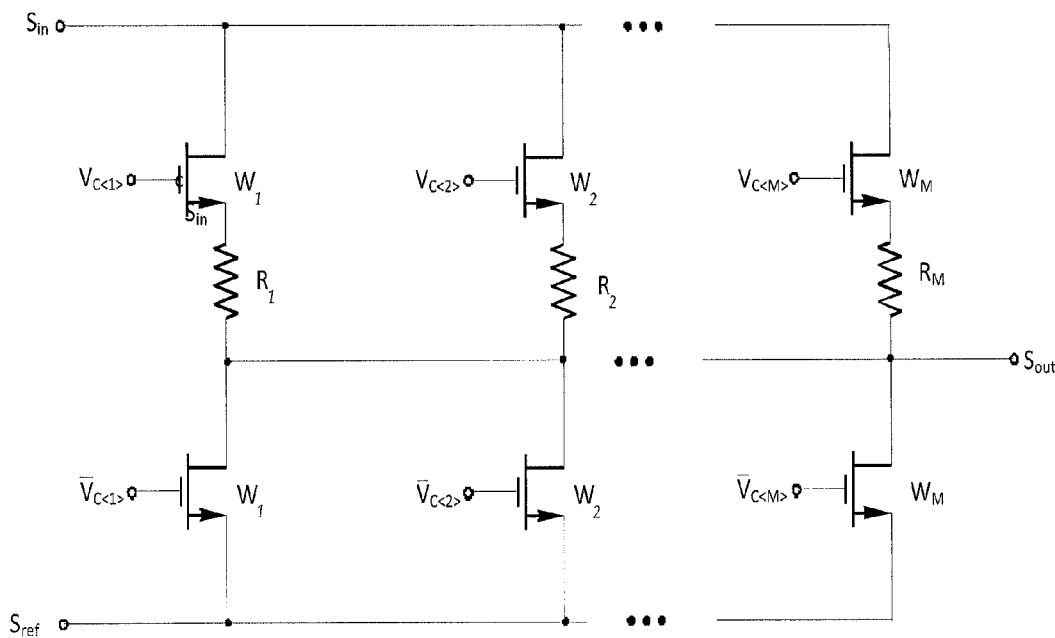
Figure 13: Schematic diagram of M-bit attenuator

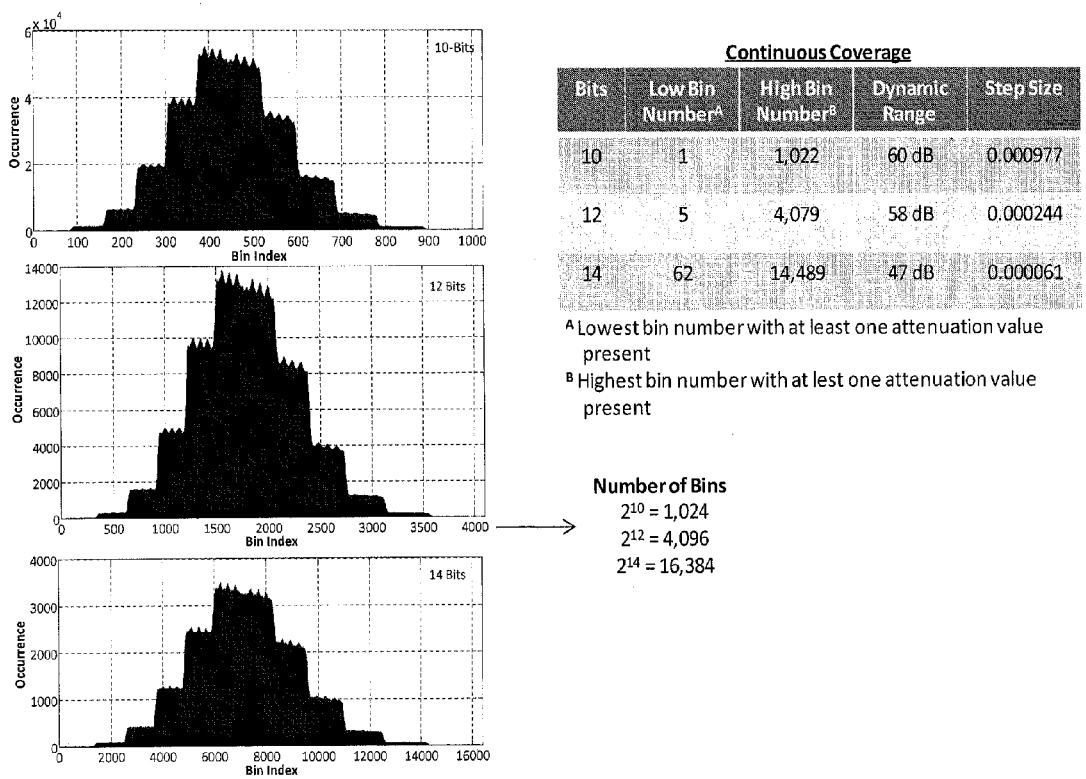
Figure 14: Distribution for M = 10, 12 and 14 bins and corresponding performance

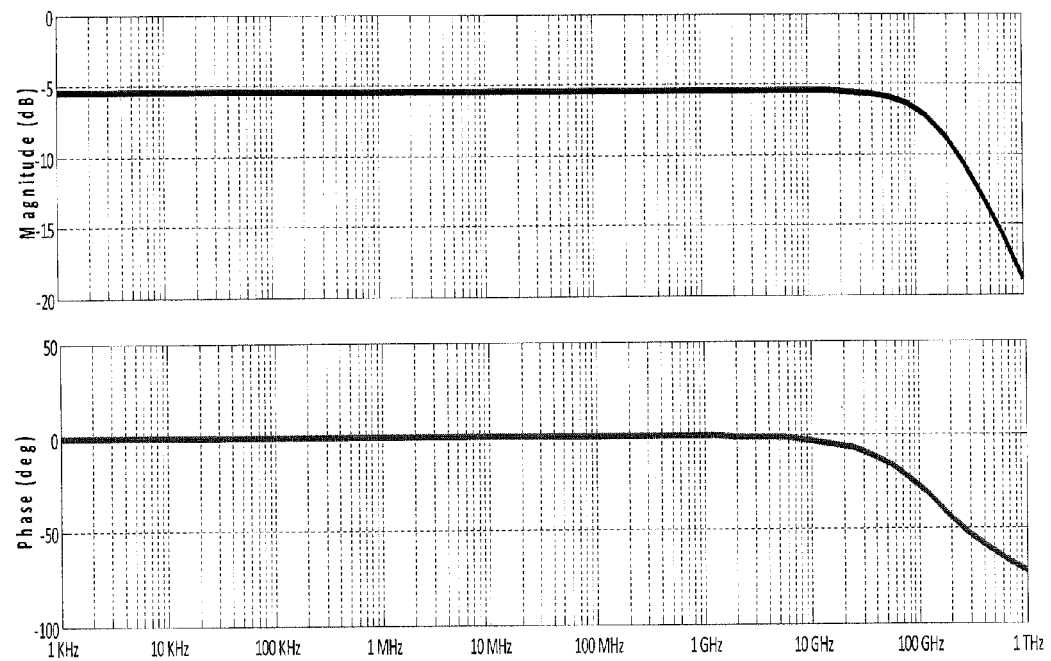
Figure 15: Magnitude and phase plots of attenuator

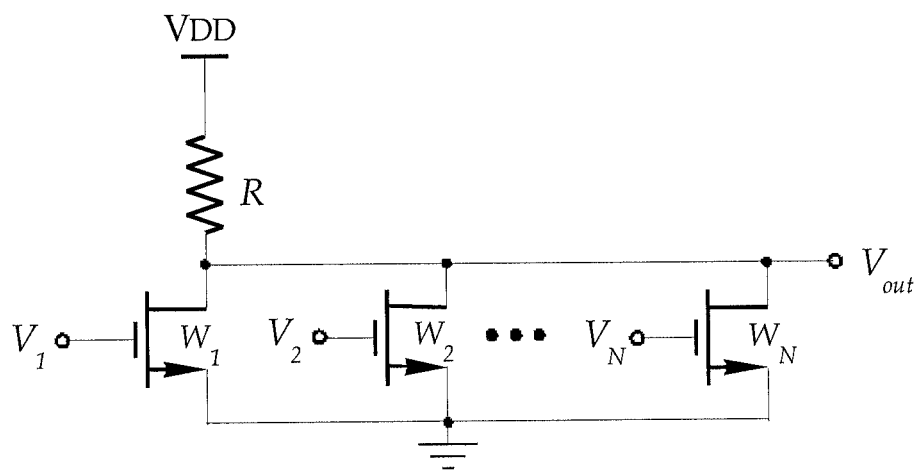
Figure 16: Broadband weighted summing circuit topology

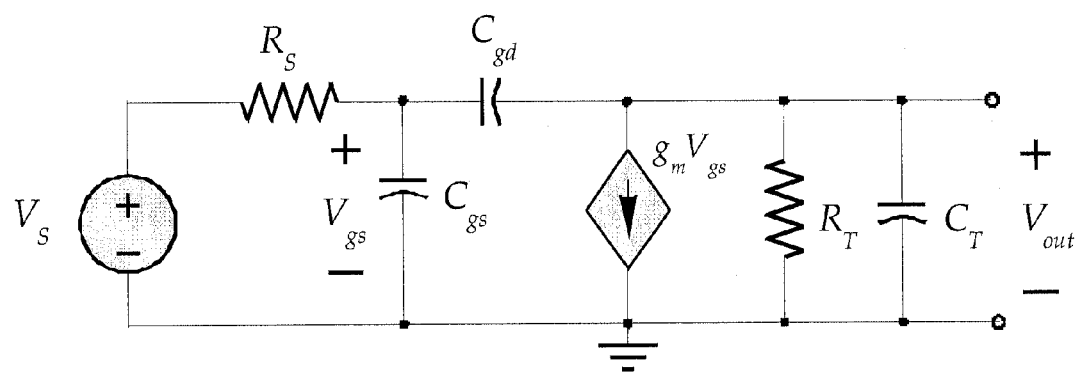
Figure 17: Circuit used in analyzing the CS amplifier high-frequency characteristic

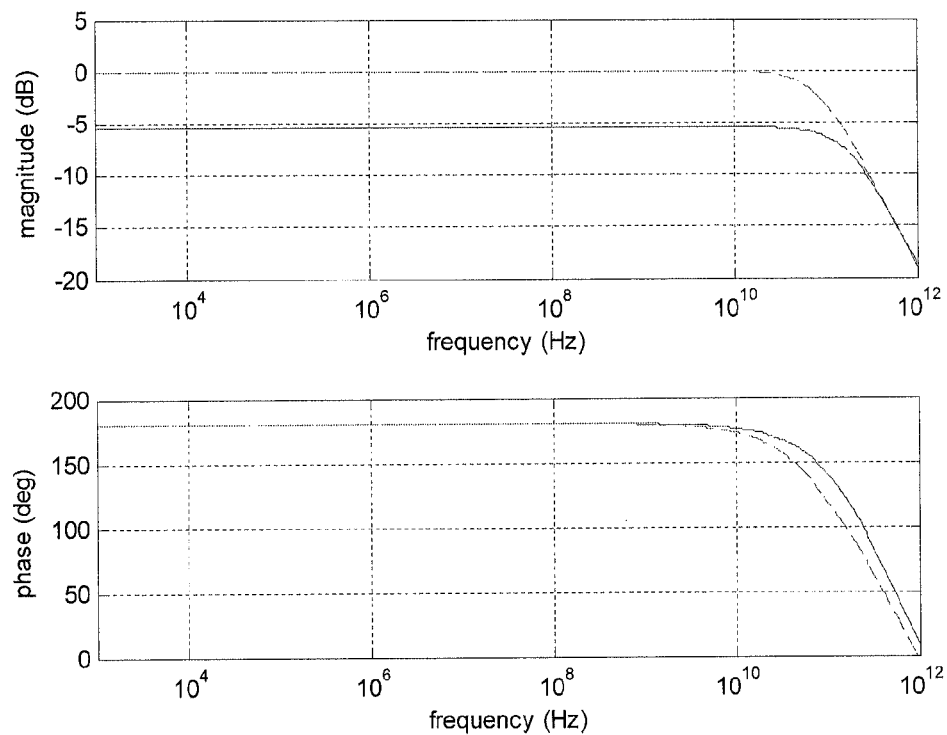
Figure 18: Frequency response of the 3-input summing circuit constructed in TSMC's 65nm process

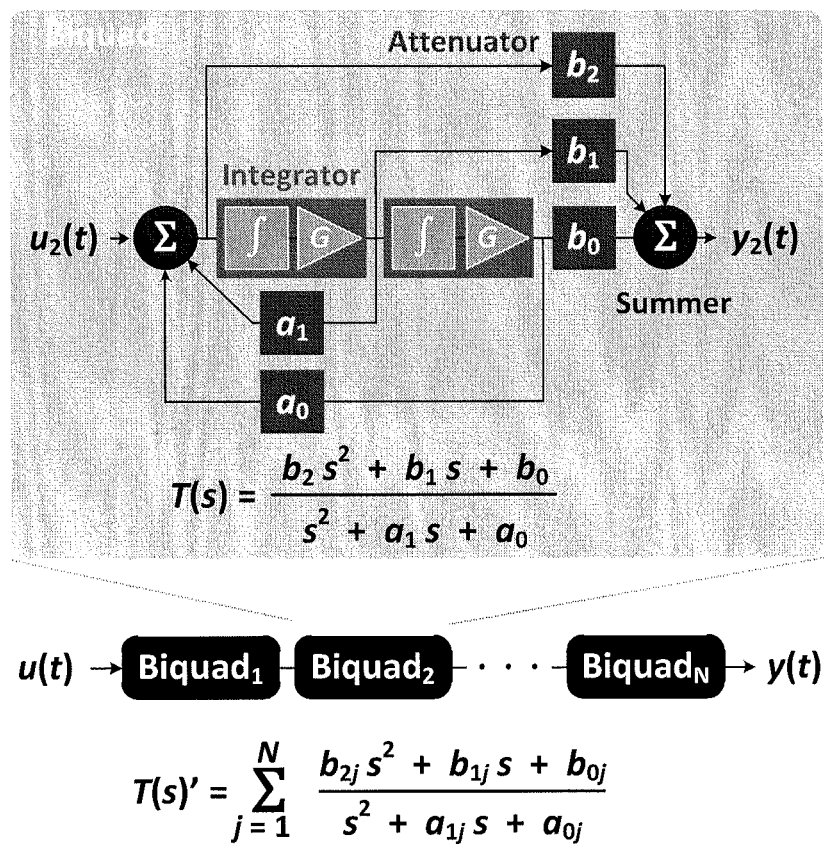
Figure 19: Cascading N biquads to achieve $2N^{th}$ order transfer function

BROADBAND ANALOG RADIO-FREQUENCY INTEGRATOR

RELATED APPLICATIONS

This application is the U.S. National Stage of International Application No. PCT/US2011/024542, filed Feb. 11, 2011, which designates the U.S., published in English, and claims the benefit of U.S. Provisional Application No. 61/359,108, filed on Jun. 28, 2010, and U.S. Provisional Application No. 61/304,064, filed on Feb. 12, 2010. The entire teachings of the above application(s) are incorporated herein by reference.

GOVERNMENT SUPPORT

The invention was supported, in whole or in part, by contract no. W911NF-08-C-0085 from the U.S. Army. The Government has certain rights in the invention.

BACKGROUND

Increases in signal bandwidth and data rates have prompted the development of new signal processing techniques to solve challenges associated with wideband signals. Increased signal bandwidth has also made new applications possible, including ultrawideband (UWB) technology-based active radio-frequency (RF) identification (ID) in heterogeneous environments. In addition, increasing signal bandwidth improves ranging accuracy, making wideband technologies especially attractive for radar, imaging, and other applications.

Unfortunately, fundamental scaling limits on clock speed, switching, heat dissipation, and difficulty of fault recovery make digital logic unsuitable for wideband signal processing. For example, today's DSP technology cannot process the wideband signals required for emerging applications such as high-definition TV, software-defined radio, cognitive radio, 4-G handheld services, white spaces, UWB-based services, and real-time GHz/THz medical imaging. Beyond the need for greater speed and bandwidth processing capability, methods for reducing power consumption also have huge appeal and utility in many signal processing applications. For example, a huge premium is placed on power consumption in mobile devices; high-speed DSPs are a huge drain on the battery life of cell-phones and PDAs.

For wideband applications, the Nyquist rate is in the multiple Gsps range and, hence, only relatively simple signal processing can be implemented and often requires highly pipelined and parallel processing architectures. Going forward, DSP technology is unlikely to reach the capabilities required by these applications because the limits of CMOS-based digital signal processing structures are not expanding according to Moore's Law any more. In fact, deep sub-micron CMOS gates have widths measured in molecules, suggesting that transistor sizes (and switching speeds) are nearing their fundamental limits. In other words, there is little room to increase the bandwidth processing ability of DSP technology because transistor switching speed, which is inversely related to transistor size, cannot get much faster.

Analog logic, in turn, has its own limitations. Because analog circuits are not formed of truly independent blocks, changing one block of analog logic can force changes in every other block in the circuit. In addition, advances in process technology occur so quickly that application-specific designs often become obsolete before they are fabricated. Finally, analog circuits are neither fully reconfigurable nor fully programmable.

SUMMARY

State variable filters with center frequencies that can be tuned with variable gain blocks coupled to outputs of filter integrators can be used to create building block elements necessary for broadband analog signal processing. For example, first- and second-order state variable filters may operate on signals in parallel and their outputs combined to produce filtered outputs. These gain-tunable state variable filters may be cascaded and/or combined in parallel for applications including, but are not limited to: agile filtering; spectrum analysis; interference detection and rejection; equalization; direct intermediate-frequency transmission; and single-sideband modulation and demodulation.

Embodiments of the present invention include broadband devices, such as integrators, attenuators, and scalable summers, that can be used to build gain-tunable state variable filters for programmable analog signal processing. Example integrators include a pair of p-channel transistors, a pair of variable resistors, and a pair of n-channel transistors connected in series between first and second voltage supply terminals. The drains of the p-channel transistors feed the drains of the variable resistors, and the sources of the pair of variable resistors feed the drains of the pair of n-channel transistors. In addition, the gates of the p-channel transistors are coupled to the drains of the opposing transistors in the pair of variable resistors in a feed-forward configuration. Complementary input signals applied to the gates of the pair of n-channel transistors drive the integrator, which produces complementary outputs at the nodes between the p-channel transistors and the variable resistors.

Further embodiments include broadband analog radio-frequency attenuators. Example attenuators include a plurality of M attenuator blocks. Each block comprises a first switch connected between a signal rail and an output node, and a second switch connected between an offset rail and the output node. Each block further includes a resistive element connected in series between the output node and the first and second switches. The attenuator provides N-bit accuracy, wherein N is less than M. In further embodiments, at least one of the blocks may have a resistive element with a resistor value corresponding to a number that is prime relative to a resistor value of a another one of the blocks.

Yet further embodiments include a broadband analog radio-frequency scalable summer. Example scalable summers include a plurality of N switches connected in parallel between an output node and a ground rail, and a resistive element connected in series between a source rail and the output node. Each of the switched may be controlled by a respective voltage input.

Compared to other devices, the devices disclosed herein are simpler to fabricate and to operate; they also operate over much broader bandwidths. Specifically, the inventive devices combine the advantages of low-frequency design with the programmability offered by state variable techniques.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 1 is a block diagram of a biquad circuit in which embodiments of the present invention may be implemented.

FIG. 2 is a circuit diagram of an integrator circuit of an embodiment of the invention.

FIG. 3 is a chart illustrating a frequency response of the integrator circuit of FIG. 2.

FIG. 4 is a circuit diagram of an integrator circuit implementing a voltage-controlled resistor.

FIG. 5 is a circuit diagram of an integrator circuit in a further embodiment.

FIGS. 6(a)-(c) are circuit diagrams of integrator circuits in still further embodiments.

FIG. 7 is a circuit diagram of an integrator circuit configured with a tuner circuit.

FIG. 8 is a block diagram illustrating a input and output of an attenuator circuit.

FIG. 9 is a circuit diagram of an attenuator circuit.

FIG. 10 is a circuit diagram of an attenuator circuit of an embodiment of the present invention.

FIG. 11 is a circuit diagram of an attenuator circuit in a further embodiment.

FIG. 12 is a chart illustrating distribution of attenuation values.

FIG. 13 is a circuit diagram of an attenuator circuit in a further embodiment.

FIG. 14 is a chart illustrating distribution of attenuation values corresponding to various configurations of an attenuator circuit.

FIG. 15 is a chart illustrating magnitude and phase of an attenuator circuit.

FIG. 16 is a circuit diagram of a summer circuit of an embodiment of the present invention.

FIG. 17 is a circuit diagram of a circuit configured to measure output characteristics.

FIG. 18 is a chart illustrating frequency response of a summer circuit.

FIG. 19 is a block diagram of a configuration of biquad circuits in which embodiments of the present invention may be implemented.

DETAILED DESCRIPTION

A description of example embodiments of the invention follows.

Wideband Signal Processing (WiSP) is analog signal processing technology; that is, it implements programmable and executable analog computing over bandwidths from 50 MHz to 20 GHz or more. The underlying basis of WiSP is state variable theory, which, when combined with CMOS deep sub-micron technology, makes it possible to extend low-frequency signal processing techniques to micron and millimeter wavelengths. WiSP may be realized in complementary-metal-oxide-semiconductor (CMOS), silicon germanium (SiGe) technology, and silicon-on-insulator (SOI) technology.

WiSP is highly accurate because parameters of the state variable machines can be set to 10 bits of accuracy. WiSP is also frequency agile, as changing state variable parameters, such as gain, makes it possible to span the whole frequency band. For example, a state variable machine that is centered about a frequency of 1 GHz may be shifted to a frequency of 10 GHz just by changing the gain parameters. WiSP technology is suitable for both linear time invariant signal processing and time variant signal processing. State variable systems can be used in single input/output mode and in multiple input/multiple output (MIMO) mode—for example, in mimicking a MIMO wireless antenna system.

Conventional, low-frequency analog design is a relatively easy and exact science mostly because the components, such as capacitors, resistors, etc., and the traces that connect them on a printed circuit board (PCB) are so small compared to the wavelength of the signals being processed. There is no distributed effect, so the components may be treated as lumped elements. Also, low-frequency analog components typically have bandwidths that are larger than (e.g., at least ten times) the signal bandwidth. This relatively high bandwidth allows the use of feedback to simplify design, to stabilize systems, to improve system performance, to make them more accurate, etc. Feedback also allows implementation of programmable hardware; for instance, op-amps with some programmable resistors can be used to build programmable gain devices. Therefore, such programmability allows one to create complex systems using a programmable approach.

Unfortunately, conventional high-frequency design does not allow for the same advantages because the wavelengths of high-frequency signals are comparable to the size of the circuit elements. The traces connecting elements on PCBs are comparable in size to the wavelength of high-frequency signals. In conventional high-frequency design, traces are treated as transmission lines and designed with the levels and dimensions necessary to prevent reflection, etc., on the PCB. In general, such designs are very power hungry, and the materials of the PCB limit the bandwidth. Also, limits on the accuracy of the printed traces may prevent these distributed elements from interacting with each other. Further, conventional high-frequency designs do not permit use of the feedback that enables very accurate designs.

Making broadband analog devices on CMOS substrates rather than PCBs enables the use of low-frequency designs because the ratio of CMOS trace size to high-frequency wavelength is about the same as the ratio of PCB trace size to low-frequency wavelength. In fact, the small trace sizes using deep sub-micron CMOS technology is on the scale of nanometers, and at nanometers scales, everything may be treated as an element; in effect, the distributed nature of the circuits can be ignored. So on a CMOS substrate, high-frequency design is the same thing as low-frequency design on a PCB except for the fact that feedback is still unavailable because component bandwidth is not high enough.

Embodiments disclosed herein offer the high-gain and extra high bandwidth necessary to enable high-frequency CMOS designs with feedback. The underlying basic elements are transconductors that have very high gain, e.g., greater than 80 dB, and up to 100 dB or 120 dB, and bandwidths in the 200 GHz range. These transconductors also may be used to build an attenuator that is accurate to one least significant bit (LSB). These attenuators can be digitally programmed with 10-bit accuracy, or about 1 part in 1,000. Such accuracy allows us to build programmable analog hardware.

Combining transconductors and attenuators with broadband scaling information allows fabrication of biquads, which are basic building blocks for building broadband analog processors. In particular, the transconductors, attenuators, and scalable summers disclosed herein can be used to create programmable biquad structures that are frequency agile and/or time-variant. These biquads may be cascaded to form programmable transfer function synthesizers, as described in PCT/US2009/001512 to Gupta et al., filed Mar. 10, 2009, published as WO2009/114123, and incorporated herein by reference in its entirety. Biquad-based circuits can be used to make agile filters, equalizers, delay lines, etc., for end uses ranging from radar to cognitive radio to radio-frequency identification.

FIG. 1 is a block diagram of a biquad circuit 100 in which embodiments of the present invention may be implemented. The biquad circuit 100 includes, as components, one or more integrators 110, attenuators 120 and summers 130. The characteristics of the biquad output y(t) can be changed by altering the transfer function, T(s), of the biquad 100. This is achieved by changing the values of the attenuators 120, which are comprised of $a_0$, $a_1$, $b_0$, $b_1$ and $b_2$. The center frequency of the transfer function is swept by changing the gain G of the integrators 110. The values of the attenuators 120 and the gain of the integrators 110 may be digitally controlled by a Serial Peripheral Interface (SPI), which has 12-bit accuracy.

FIG. 2 illustrates an integrator circuit 200 that may be implemented in the biquad circuit 100 of FIG. 1. The integrator 200 is a broadband self-tuned integrator using feedforward-regulated topology. The integrator 200 has a high bandwidth, high linearity and low intermodulation distortion which make it suitable especially for applications at microwave frequencies.

Small signal analysis shows that the transfer function of this circuit is of the form:

$$T(s) = \frac{\Omega_0 \cdot (s/z_1 - 1) \cdot (s/z_2 - 1)}{s \cdot (s/p + 1) + a_0}$$

where $$z_1 = \frac{g_{m1}}{C_{gd1}}$$

$$z_2 = \frac{(g_{m3} + 1/R)}{C_{gd3}}$$

$$\Omega_0 = \frac{g_{m1} \cdot (g_{m3} + 1/R)}{(C_{gs3} + C_{gd3} + C_{gd1} + C_{ds1}) \cdot (g_{ds3} + 1/R) + (C_{gd3} + C_{ds3}) \cdot (g_{ds1} + 1/R) + C_{gd3} \cdot (g_{m3} + 2/R)}$$

$$p = \frac{(C_{gs3} + C_{gd3} + C_{gd1} + C_{ds1}) \cdot (g_{ds3} + 1/R) + (C_{gd3} + C_{ds3}) \cdot (g_{ds1} + 1/R) + C_{gd3} \cdot (g_{m3} + 2/R)}{(C_{gs3} + C_{gd3} + C_{gd1} + C_{ds1}) \cdot (C_{gd3} + C_{ds3}) - C_{gd3}^2}$$

$$a_0 = \frac{(g_{ds1} + 1/R) \cdot (g_{ds3} + 1/R) - (g_{m3} + 1/R)/R}{(C_{gs3} + C_{gd3} + C_{gd1} + C_{ds1}) \cdot (g_{ds3} + 1/R) + (C_{gd3} + C_{ds3}) \cdot (g_{ds1} + 1/R) + C_{gd3} \cdot (g_{m3} + 2/R)}$$

The resistor R is usually chosen to be small compared to $1/g_{m1}$, $1/g_{m3}$, $1/g_{ds1}$, and $1/g_{ds3}$. For deep submicron CMOS technology (for example 130 nm or below), it is usually true that $C_{gs}$ dominates all the parasitic capacitance. In view of this, we have:

$$z_1 > \frac{g_{m1}}{C_{gs1}} \approx 2\pi \cdot f_T$$

$$z_2 > \frac{1}{R \cdot C_{gd3}}$$

$$p \approx \frac{1}{R \cdot C_{gd3}}$$

with $f_T$ being the unity gain frequency which is usually large. For small R, $z_2$ and p are usually very large. The transfer function can hence be approximated as $$T(s) \approx \frac{\Omega_0}{s + a_0}$$

Note that $a_0=0$ if R is chosen to be $$R = \frac{g_{m3} - g_{ds1} - g_{ds3}}{g_{ds1} \cdot g_{ds3}}$$

This further simplifies the transfer function to $$T(s) \approx \frac{\Omega_0}{s}$$

which is exactly the response of a perfect integrator. Note that the transistors are usually chosen such that $g_{m1} > g_{m3}$ hence $$\Omega_0 \approx \frac{g_{m1}}{C_{gs3}} > \frac{g_{m3}}{C_{gs3}} \approx 2\pi \cdot f_T$$

This implies that the unity gain frequency of the integrator 200 is approximately the same as that of the technology.

FIG. 3 illustrates the frequency response of the integrator 200 as implemented in TSMC's 65 nm CMOS. The unity frequency is about 60 GHz. The magnitude has 20 dB/dec of roll off from about 10 MHz to 60 GHz while the phase is approximately −90° (within)±10° from 50 MHz to 10 GHz.

Embodiments of an integrator circuit 200 as shown in FIG. 2 may be modified in a number of ways. As shown in the integrator circuit 400 of FIG. 4, the middle resistor R in FIG. 2 may be implemented using a transistor whose gate is connected to a voltage source. The resistance value (hence the value of a0 in the transfer function) can be varied simply by varying the voltage. This enables users to tune the integrator through a feedback control circuit as will be explained in the next section.

FIG. 5 illustrates a further embodiment of an integrator circuit 500, wherein the resistance of M2 (and M5) in FIG. 4 is controlled by the voltage VcR. Usually the resistance decreases as VcR increases. In order to prevent VcR to become too large, a fixed resistor can be added in parallel with M2 (and M5).

FIGS. 6(a)-(c) illustrate still further embodiments of integrator circuit 601, 602, 603. In order to further improve the linearity, two source degeneration resistors can be added on top as shown in the integrator circuit 601 FIG. 6(a). A slightly different approach is to split the current source into two identical ones and a single source degeneration resistor can be added between the two branches as shown in the integrator circuit 602 of FIG. 6(b). In FIG. 6(c), an integrator circuit 603 includes both top and bottom source degeneration resistors.

FIG. 7 illustrates an integrator circuit 701 (such as the integrator circuits described above with reference to FIGS. 2 and 4-6) configured with an tuning circuit 702 to form an integrator tuning circuit 700. As described above, the voltage VcR must be chosen correctly in order to achieve a perfect integrator. This selection is done through the tuning circuit 702. The complete tuning circuit includes two parts, namely, DC calibration and gain control. In order for the DC calibration to work, two identical buffers (for example, source followers) are inserted in front of the integrator. One buffer is biased with a fixed voltage Vfix while the other one is controlled through a feedback loop which is simply an integration circuit that takes the differential outputs of the integrator as its inputs. The DC calibration circuit ensures the differential outputs of the integrator having approximately the same bias voltage. This eventually ensures the integrator to have a high common mode rejection when it is tuned.

As VcR varies, the DC-calibrated integrator may have significant phase variations at low frequencies and the phase varies monotonously with the VcR. The gain control circuit is hence essentially a phase detector that drives the DC-calibrated integrator to have the desired phase response at a given low frequency.

As shown in FIG. 7, the oscillator generates a 200 kHz signal, which is fed to the integrator whose output is then amplified. The same 200 kHz signal is also fed to a phase shifter (PS) and a single-to-differential converter (S2D) and then amplified (using the same amplifier). Both amplified signals are fed to a multiplier. The DC component of the multiplier indicates the phase difference between the two amplified signals. More specifically, the DC value is maximized when they are in phase and is zero when the phase is 90 degrees out of phase. With a properly chosen phase value for the phase shifter, the integration circuit following the multiplier drives the integrator to have the desired phase response at 200 kHz, hence the desired VcR value.

FIG. 8 illustrates an attenuator circuit 800 with respective input and output signals. Attenuators reduce a signal in proportion to a given binary number specified by a processor or DSP. Attenuators are designed to be either "linear in voltage" or "linear in dB." The attenuator 800 is a "liner in voltage" attenuator. A "linear in dB" attenuator is similar except the attenuation is carried out in dBs.

Applications of attenuators include signal processing elements in cellular networks, cable modems, digital subscriber loops, imaging systems, adaptive filters and equalizers used in diverse applications. Tens of millions of attenuators are sold in the microwave components markets and many times more are incorporated in VLSIs designs.

FIG. 9 illustrates a typical attenuator 900 employing a R/2R ladder. Typical attenuator designs use multistage resistive ladders to implement the attenuator function. There are as many stages as there are bits in the binary bits controlling the attenuation. As the desired accuracy grows the numbers of stages grow and the tolerances get worse. This limits the realizable dynamic range. In CMOS design this limits the usefulness of this structure to 6 to 8 bits and a dynamic range of 64 to 256. Higher accuracy is achievable with laser trimming, but this increases the cost. Also, each stage has an intrinsic bandwidth and as many stages are cascaded, the bandwidth decreases. Hence, if a low cost, broadband attenuator with 10 or more bits accuracy is desired this multistage resistive ladder architecture will not be useable.

FIG. 10 illustrates an attenuator circuit 1000 in an embodiment of the invention, which overcomes the limitations described above using a stochastic design technique. Here, a single stage attenuator 1000 consists of a group of resistors R that can be switched into the series arm (between the source and the output) or into the load arm (between the output and ground). Each resistor is either in the series arm or otherwise in the load arm.

If the resistors are arranged in the ratio R, 2R, 4R, ..., (2N)R, then it is easy to show that we have a N-bit attenuator. Since the switches, which are either on or off FETs, typically have capacitance, we can expect that the larger resistors will create bandwidth problems. The smallest resistor has to be significantly bigger than the switches on impedance, so the largest resistor will be really big for N>9. This is a real problem for broadband performance. Also the largest resistor will become really big and this will use up a lot of silicon area. Accuracy will be compromised particularly with temperature since different families of resistors (with different thermal coefficients) will have to be used to accommodate the large range of resistor values, one family not having enough range.

The bandwidth problem can be mitigated by selecting FET switch sizes inversely proportional to the resistor size so the RC time constant of each arm is the same. Theoretically, this should give infinite bandwidth. However the ratio of the largest to smallest FET will become very large and there will be layout and silicon size problems because the smallest FET would have to be large enough to have mismatch related variance be small relative to the smallest resistor.

The attenuator 1000 uses N resistors to provide $2^N$ values of attenuation. Such an attenuator has N degrees of freedom since the designer can only set N values. If the attenuator is ideal, it will provide $2^N$ equally spaced points of attenuation on the number line going from 0 to 1. The distribution of attenuation values will thus be uniform (subject to $\frac{1}{2}^N$ binning) over the interval [0, 1]. In a non-ideal situation many bins will be empty and many bins will have multiple values. With laser trimming one can try to change the distribution to move the attenuation values to have a value present in every bin. But this is difficult and expensive.

FIG. 11 illustrates an attenuator circuit 1100 in a further embodiment. In some embodiments, there are M degrees of freedom (number of resistors) where M>N. One can create 2M points along the interval [0, 1]. By choosing the M resistors properly, one can create a distribution with multiple points in each of the $2^N$ bins. One can then do a Monte Carlo simulation with resistor/FET tolerances included to verify that a large percentage of results will still yield a distribution with at least one point in every bin. The finished product can then be calibrated by running through the $2^M$ points to determine the control M bit combinations that correspond to the $2^N$ desired values. This table can be stored in memory of size $2^N$ words each M bit long. When the N address lines are set up to the desired attenuation value, the memory puts out (on the data bus) the corresponding M bit value to the attenuator which then leads to the desired attenuation. If one desires N* bit accuracy with N<N*<M but is willing to put up with a few missing codes (e.g. near the 0 or 1 corner), then that program can be put into memory of size $2^{N*}$ words of size M. Such an embodiment is illustrated in the attenuator circuit 1100 of FIG. 11.

FIG. 12(a) illustrates a distribution of the achieved attenuation for an attenuator circuit having N-bit accuracy, M-degrees of freedom network with resistors R, 2R, ..., (2N)R. Now if one dithers (changes) the values of each resistor by a uniformly distributed random variable lying in the interval (1−x/100, 1+x/100, i.e., an error of x percent), a typical realization for the same control bit pattern is shown in FIG. 12(b). As can be seen, the distribution now has a spread around the values shown in FIG. 12(a). This method can be used to fill in empty bins around some populated bins, especially in the middle of multiple populated bins. This result may be referred to as "smoothing the distribution."

FIG. 13 shows a M bit (in this example M=24) attenuator 1300 with N bit (in this example N=12) accuracy. The maximum resistor (and hence FET switch) ratio is approximately 64. We begin with resistors R, 2R, 4R, 8R, 16R, 32R, 64R and add resistors of value 59R, 53R, 47R, 43R, 41R, 37R, 31R where the numbers 59, 47, 43, 41, 37, 31 are prime to the numbers 2, 4, 8, 16, 32, and 64. The resulting distribution is dithered to get the best possible distribution (maximum range of fill) in the 2N bins using x=5%. We then fill with resistors of value R until we have M resistors (here we add 10 resistors of value R).

FIG. 14 illustrates a distribution that results for N=10 to N=14 bins. A Monte Carlo simulation shows that FETs and resistors have approximately 1.5% variation under mismatch in 65 nm CMOS technology when minimum resistors of size R=100Ω and minimum FETs of size 0.12 μm are used. The simulations are configured with x set at 2%, and a long run shows that 500 out of 500 designs meet the requirement that for N=12, all but the two extreme bins 0 and 1023 of this 212 bins in the range [0, 1] have at least one element.

FIG. 15 illustrates the frequency domain performance of the attenuator 1300 for a specific loss pattern. In general, the attenuator exhibits greater than 10 GHz of bandwidth at all other attenuation values.

To calibrate a specific attenuator, one starts with the nominal design. One creates a table of bins and up to 10 control bit combinations distributed across each bin. Of course bins that have less than ten control bit combinations have all their elements listed.

For the attenuator being calibrated, one starts with bin i, (1≤i≤=2N), and the nominal control bit pattern for that bin. One measures the actual attenuation achieved and computes the error. The error is multiplied by 2N to determine how many bins to move to correct the error. The direction of movement depends on the polarity of the error. If the measured value is too high one moves in the direction of lower bin values and vice versa. The new control bit pattern is determined (some control pattern in the selected bin may give better values than others, here we retain the best) and the process repeated until the desired accuracy is achieved. In practice it has been found that one gets the desired accuracy in 2 to 3 steps.

The entire process is repeated for all the bins until one gets the entire table of 2N bin values and corresponding control bit patterns.

The methods described above provide a highly accurate, low cost, high bandwidth, high yield CMOS attenuator. For a desired N bit accuracy, we begin with M (M>N) resistors and switches. By choosing M sufficiently larger than N we get enough accuracy to statistically "guarantee" that a large percentage of attenuators will meet the N bit accuracy in spite of component tolerances. No laser trimming is required in the manufacturing process.

Further, methods for choosing the resistors for optimal distributions have been described. A method to calibrate a specific realization of the attenuator has been described. Although the example embodiments described above provide a "linear in voltage" attenuator, one of skilled in the art may apply the same methods to create a "linear in dB" attenuator.

FIG. 16 illustrates a summer circuit 1600 that may be implemented in the biquad circuit 100 described above with reference to FIG. 1. The summing circuit 1600 comprises a single resistor R and N transistors. The summer 1600 can be used in circuit topologies that require broadband analog signal processing. The number of transistors N is determined by the number of input signals that will be summed.

The summer receives input signals $V_1$, $V_2$, $V_N$, and provides output signal $V_{out}$, all of which contain the DC and the AC terms. The resistor R sets the DC current through the summing network and contributes to the overall gain of the summing block. By using superposition and therefore taking into account one transistor at the time, we are left to analyze a common source (CS) amplifier. By ignoring the DC bias term at the output and focusing only on the AC term, the output for CS amplifier is given by $$v_0 = -g_m v_{in}(R \| r_0). \qquad \text{Equation 1}$$

In Equation 1, term $g_m$ is the gain of the transistor (i.e., transconductance) and $r_o$ is the output resistance of the transistor. Assuming that $r_0 \gg R$ the overall output of the circuit in FIG. 1 is given by $$v_{out} = -(g_{m1}v_1 + g_{m2}v_2 + \ldots + g_{mN}v_N)R \qquad \text{Equation 2}$$

In Equation 2, the $g_m$ terms that accompany the input signals can be viewed as the summing coefficients. Because the resistor R is fixed, we can adjust the summing coefficients by changing the transistor gain $g_m$. The transistor gain $g_m$ can be expressed in terms of the transistor width W, $$g_m = \mu_n C_{ox} \frac{W}{L}(V_{GS} - V_{TN}). \qquad \text{Equation 3}$$

According to Equation 3, the transistor gain is directly proportional to the transistor width and therefore by varying the transistor width we can adjust the summing coefficients.

The bandwidth of the summing circuit 1600 is determined by the CS amplifier bandwidth. FIG. 17 illustrates an equivalent small-signal circuit model 1700 that is commonly used in analyzing the high-frequency behavior of the CS amplifier. Resistor $R_T$ is given by $R \| r_O$ and capacitor $C_T$ is the total capacitance between the output node and ground of the transistor (i.e., load capacitance, internal parasitic capacitance of the transistor, and the input capacitance of the subsequent stages).

For applications where $R_S$ is relatively large and $C_T$ is relatively small the bandwidth of the CS amplifier.

$$f_{3dB} = \frac{1}{2\pi(C_{gs} + C_{gd}(1 + g_m R_T))R_S}. \qquad \text{Equation 4}$$

For applications where $R_S$ is small the bandwidth of the CS amplifier.

$$f_{3dB} = \frac{1}{2\pi(C_L + C_{gd})R_T} \qquad \text{Equation 5}$$

From above equation, it is shown that high bandwidth can be achieved with small R (since $R_T$ is given by $R \| r_O$). This usually results in a loss. In order to reduce the loss or to get some gain, R needs to be increased, which usually compromises the bandwidth.

A 3-input summing circuit was constructed in Cadence using TSMC's 65 nm process. FIG. 18 shows the frequency response for the given circuit with the source resistance $R_S$ set to 10Ω. The solid lines correspond to the case with R=26 μl. The circuit has 5.4 dB of loss but has a 3-dB bandwidth of approximately 200 GHz. The dashed lines corresponds to the case with R=60Ω. The circuit has approximately 0 dB of loss and the 3-dB bandwidth is reduced to 90 GHz.

FIG. 19 illustrates a series of biquad circuits 1900 in which embodiments of the integrators, attenuators and summers described above may be implemented. The biquad configuration is a second order state variable structure. $2N^{th}$ order transfer function T(s)' is obtained by cascading N biquads.

The transfer functions shown in FIG. 19 also describe a single input single output (SISO) field programmable analog array (FPAA). By varying the values of the attenuators and the integrator gains, one can obtain an assortment of adaptive filter and delay line characteristics. The ability to work in the analog domain offers engineers a powerful tool to process wideband signals.

While this invention has been particularly shown and described with references to example embodiments thereof, it will be understood by those skilled in the art that various changes in form and details may be made therein without departing from the scope of the invention encompassed by the appended claims.

What is claimed is:

1. A broadband analog radio-frequency integrator comprising:
    first and second p-channel transistors including respective sources coupled in parallel to a first voltage supply terminal and respective drains configured to provide complementary output signals;
    first and second variable resistors including respective first terminals coupled to the drains of the first and second p-channel transistors, respectively, and respective second terminals coupled to gates of the second and first p-channel transistors, respectively; and
    first and second n-channel transistors including respective drains coupled to the second terminals of the first and second variable resistors, respectively, respective gates configured to receive complementary input signals, and respective sources in electrical communication with a second voltage supply terminal.

2. The integrator of claim 1, further including a bias transistor connected in series between the second voltage supply terminal and the sources of the first and second re-channel transistors.

3. The integrator of claim 1, wherein the first and second variable resistors include third and fourth n-channel transistors, respectively, and further including a third voltage supply terminal in electrical communication with the gates of the third and fourth n-channel transistors, the third voltage supply configured to control resistance of the first and second variable resistors.

4. The integrator of claim 1, wherein the integrator is fabricated using deep sub-micron complementary-metal-oxide-semiconductor, silicon germanium, or silicon-on-insulator techniques.

5. The integrator of claim 1, wherein the transistors are interleaved with each other to reduce bias offset.

6. The integrator of claim 1, further comprising a tuning circuit configured to adjust sampling of an output of the integrator.

7. The integrator of claim 6, wherein the tuning circuit further comprises a DC calibration circuit and a gain control circuit.

8. The integrator of claim 1, wherein the first and second variable resistors include third and fourth n-channel transistors, respectively, the third and fourth n-channel transistors including respective drains coupled to the drains of the first and second p-channel transistors, respectively, respective sources coupled to gates of the second and first p-channel transistors, respectively, and respective gates coupled to each other.

* * * * *

UNITED STATES PATENT AND TRADEMARK OFFICE
CERTIFICATE OF CORRECTION

PATENT NO.        : 8,866,531 B2  
APPLICATION NO.   : 13/576635  
DATED             : October 21, 2014  
INVENTOR(S)       : Dev V. Gupta and Zhiguo Lai Page 1 of 1

It is certified that error appears in the above-identified patent and that said Letters Patent is hereby corrected as shown below:

IN THE CLAIMS:

Claim 2, Column 11, Line 24, delete "re-channel" and add -- n-channel --

Signed and Sealed this  
Tenth Day of February, 2015

Michelle K. Lee  
*Deputy Director of the United States Patent and Trademark Office*